United States Patent

Katsumata et al.

[11] Patent Number: 6,153,354
[45] Date of Patent: Nov. 28, 2000

[54] ELECTRON BEAM NEGATIVE WORKING RESIST COMPOSITION

[75] Inventors: Yasuhiko Katsumata; Kiyoshi Ishikawa; Katsumi Oomori, all of Kanagawa, Japan

[73] Assignee: Tokyo Ohka Kogyo Co., Ltd., Kanagawa, Japan

[21] Appl. No.: 09/391,195

[22] Filed: Sep. 7, 1999

[30] Foreign Application Priority Data

Sep. 8, 1998 [JP] Japan .................................. 10-253665

[51] Int. Cl.$^7$ ...................................... G03F 7/004
[52] U.S. Cl. ...................... 430/270.1; 430/296; 430/926
[58] Field of Search ................................. 430/296, 270.1, 430/926

[56] References Cited

U.S. PATENT DOCUMENTS 5,296,332  3/1994  Sachdev et al. ...................... 430/270
5,302,725  4/1994  Kaji et al. .............................. 548/479

Primary Examiner—Janet Baxter
Assistant Examiner—Rosemary Ashton
Attorney, Agent, or Firm—Sughrue, Mion, Zinn, Macpeak & Seas, PLLC

[57] ABSTRACT

An electron beam negative working resist composition is diclosed including: (A) an alkali-soluble resin, (B) an acid-crosslinkable substance, (C) an acid generating agent, and (D) a sensitizing substance, the sensitizing substance (D) being a substance which serves to accumulate electrons or energy through electron beam exposure and to reemit the accumulated electrons or energy into a resist film. Thus, the electron beam negative working resist composition can achieve a desired high sensitivity.

6 Claims, No Drawings

ELECTRON BEAM NEGATIVE WORKING RESIST COMPOSITION

BACKGROUND OF THE INVENTION

1. Field of the Invention

This invention relates to electron beam negative working resist compositions having high sensitivity.

2. Description of the Related Art

A variety of negative working resist compositions which form patterns by electron beam exposure have been proposed (e.g., Japanese Patent Laid-Open Nos. 5-249676, 9-34112 and 10-90901).

Processes for the formation of patterns using an electron beam as a light source can increase the definition of resultant patterns as compared with processes using i-line, excimer laser beams or other active rays as a light source, and the application of the former processes to the production of next-generation ultralarge scale integrated semiconductor devices of 256-megabit, 1-gigabit, 4-gigabit or higher are now under study.

Such pattern formation processes, however, use a technique of scanning an electron beam and thus imaging a mask pattern, in contrast to full wafer alignment in pattern lithography using i-line, excimer laser beams or other light sources, and required exposure time (time for imaging) and the time required for the formation of patterns increase with an increase in patterns to be imaged.

With exponentially increasing integration such as 256 megabits, 1 gigabit, 4 gigabits or higher, the time for the formation of patterns markedly increases, which may result in markedly deteriorated throughput.

Thus, the practical use of pattern formation processes using an electron beam essentially requires as short an exposure time as possible, and strong demands have been made to provide a resist composition that is a pattern forming material having satisfactorily enhanced sensitivity.

SUMMARY OF THE INVENTION

Accordingly, it is an object of the present invention to provide an electron beam negative working resist composition which can achieve a desired high sensitivity.

After intensive investigation to solve the above problem, the present inventors found that the addition of a specific sensitizing substance to an electron beam negative working resist composition can achieve high sensitivity. The present invention has been accomplished based upon the above finding.

To be more specific, the invention provides an electron beam negative working resist composition including: (A) an alkali-soluble resin, (B) an acid-crosslinkable substance, (C) an acid generating agent, and (D) a sensitizing substance, the sensitizing substance (D) being a substance which serves to accumulate electrons or energy through electron beam exposure and to reemit the accumulated electrons or energy into a resist film.

In the above composition, the sensitizing substance (D) may be a compound represented by the following formula (I):

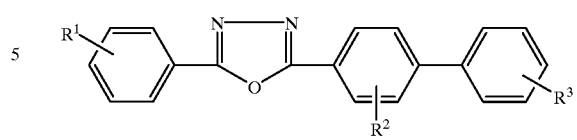

wherein $R^1$ is an aryl group or an alkyl group having 1 to 10 carbon atoms, each of $R^2$ and $R^3$ is independently a hydrogen atom, an aryl group or an alkyl group having 1 to 10 carbon atoms.

Preferably, the sensitizing substance (D) in the composition may be a compound represented by the following formula (II):

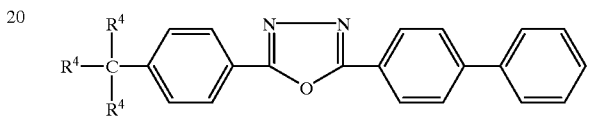

wherein $R^4$ is an alkyl group having 1 to 3 carbon atoms.

The above composition may include Ingredient (D) in a content ranging from 0.1 to 10 parts by weight relative to 100 parts by weight of Ingredient (A).

DETAILED DESCRIPTION OF THE INVENTION (A) Alkali-soluble resin

Alkali-soluble resins used as Ingredient (A) are not limited and can be chosen from those conventionally used in electron beam negative working resist compositions. Illustrative alkali-soluble resins include: novolak resins obtained by condensation of a phenol compound such as phenol, m-cresol, p-cresol, xylenol or trimethylphenol with an aldehyde such as formaldehyde in the presence of an acidic catalyst; hydroxystyrene homopolymers, copolymers of a hydroxystyrene and another styrenic monomer, copolymers of a hydroxystyrene and acrylic acid, methacrylic acid or a derivative thereof, and other polyhydroxystyrenic resins; acrylic ormethacrylic resins which are copolymers of acrylic acid or methacrylic acid and any of their derivatives; as well as resins composed of a polyhydroxystyrene, part of whose hydroxyl groups is protected by an acid-dissociating substituent.

The styrenic monomer to be copolymerized with a hydroxystyrene includes, for instance, styrene, a-methylstyrene, p-methylstyrene, o-methylstyrene, p-methoxystyrene and p-chlorostyrene. Examples of the acrylic or methacrylic derivatives include methyl acrylate, ethyl acrylate, 2-hydroxyethyl acrylate, 2-hydroxypropyl acrylate, acrylamide, acrylonitrile and methacrylic derivatives corresponding to these acrylic derivatives. Illustrative acid-dissociating substituents include tert-butoxycarbonyl group, tert-amyloxycarbonyl group and other tertiary alkyloxycarbonyl groups; tert-butoxycarbonylmethyl group and other tertiary alkyloxycarbonyl-substituted alkyl groups; tert-butyl group and other tertiary alkyl groups; ethoxyethyl group, methoxypropyl group and other alkoxy-substituted alkyl groups, tetrahydropyranyl group, tetrahydrofuranyl group and other acetal groups; benzyl group, and trimethylsilyl group. To achieve high contrast between exposed and unexposed areas, preferably 1% to 60% by mole, more preferably 10% to 50% by mole of the total hydroxyl groups in the polyhydroxystyrene may be protected by an acid-dissociating substituent.

Of these alkali-soluble resins, those having a molecular weight distribution (a ratio, Mw/Mn, of the weight average molecular weight (Mw) to the number average molecular weight (Mn)) of equal to or less than 3.5 are preferable for their satisfactory resist pattern forming properties. They are known as monodisperse resins and are commercially available. Separately, novolak resins having a Mw/Mn ratio exceeding 3.5 may be converted to those having a Mw/Mn ratio of equal to or less than 3.5, by removing low molecular weight fractions from the resins. The removal of low molecular weight fractions can be conducted by known fractional treatments.

As Ingredient (A) used in the invention, polyhydroxystyrenes, polyhydroxystyrenes having hydroxyl groups protected by an acid-dissociating substituent, copolymers of a hydroxystyrene and styrene, and cresol novolak resins are preferable, of which cresol novolak resins having a molecular weight distribution ratio (Mw/Mn) of equal to or less than 3.5, polyhydroxystyrenes having a molecular weight distribution ratio (Mw/Mn) of equal to or less than 1.5, copolymers of a hydroxystyrene and styrene, resins composed of a polyhydroxystyrene part of whose hydroxyl groups is protected by tert-butoxycarbonyl group can advantageously be used for the formation of patterned resist having excellent heat resistance and contrast. The terms "weight average molecular weight (Mw)" and "number average molecular weight (Mn)" as used herein are defined as the values in terms of polystyrene measured by gel permeation chromatography (GPC).

Each of these alkali-soluble resins as Ingredient (A) can be used singly or in combination.

(B) Acid-crosslinkable substance

Acid-crosslinkable substances to be used as Ingredient (B) which crosslinks in the presence of an acid are not particularly limited and include compounds conventionally used as crosslinking agents in electron beam negative working resist compositions. Preferred acid-crosslinkable substances include amino resins having hydroxy or alkoxy groups, such as melamine resins, urea resins, guanamine resins, glycol uryl-formaldehyde resins, succinylamide-formaldehyde resins, and ethyleneurea-formaldehyde resins. These resins can be readily obtained by the methylolation reaction of melamine, urea, guanamine, glycoluryl, succinylamide, ethyleneurea and the like with formaldehyde in boiling water, optionally, followed by an alkoxylation reaction with a lower alcohol. Of these resins, melamine resins and urea resins having hydroxymethyl or alkoxymethyl groups are preferred, of which a melamine resin having a large quantity of hexamethoxymethylated melamine is typically desirable.

The aforementioned melamine resins and urea resins are available, for example, as commercial products under the trade names of Nikalacs MX-750, MW-30, MW-30HM, MW-1OOLM, and MX-290 (each a product of Sanwa Chemical Co.) and can be used as such in the present invention.

As the acid-crosslinkable substance, 1,3,5-tris (methoxymethoxy)benzene, 1,2,4-tris(isopropoxymethoxy) benzene, 1,4-bis(sec-butoxymethoxy)benzene and other benzene compounds having alkoxy groups; 2,6-dihydroxymethyl-p-cresol, 2,6-dihydroxymethyl-p-tert-butylphenol and other phenol compounds having hydroxyl or alkoxy groups.

Each of these acid-crosslinkable substances may be used independently or in combination.

The proportion of Ingredient (B) should preferably fall in the range of from 1 to 70 parts by weight, and typically from 3 to 10 parts by weight relative to 100 parts by weight of Ingredient (A).

(C) Acid generating agent

Acid generating agents as used in the present invention are not limited, and preferably include acid generating agents represented by the following formula (III) and (IV):

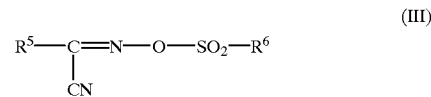
(III)

wherein $R^5$ is an aromatic group and $R^6$ is a lower alkyl group or a halogenated lower alkyl group;

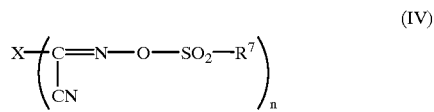
(IV)

wherein X is a divalent or trivalent hydrocarbon group, $R^7$ is a hydrocarbon group or a substituted hydrocarbon group, and n is 2 or 3. The use of these acid generating agents can provide high γ-value, i.e., high contrast and definition, and high sensitivity and can form a patterned resist having a good shape.

Examples of the aromatic group represented by $R^5$ in the formula (III) include phenyl group, naphthyl group, furyl group and thienyl group. Each of these groups may have one or more substituents on its ring. The substituents include, for instance, chlorine, bromine, iodine and other halogen atoms, alkyl groups, alkoxy groups and nitro group. As examples of the lower alkyl group represented by $R^6$, there may be mentioned straight-chain or branched alkyl groups each having 1 to 4 carbon atoms such as methyl group, ethyl group, n-propyl group, isopropyl group, n-butyl group, isobutyl group, sec-butyl group and tert-butyl group. The halogenated lower alkyl group represented by $R^6$ includes, for instance, halogenated alkyl groups each having 1 to 4 carbon atoms, such as chloromethyl group, trichloromethyl group, trifluoromethyl group and 2-bromopropyl group.

Typical examples of the oxime sulfonate compounds represented by the formula (III) include α-(methylsulfonyloxyimino)-phenylacetonitrile, α-(methylsulfonyloxyimino)-4-methoxyphenylacetonitrile, α-(trifluoromethylsulfonyloxyimino)-phenylacetonitrile, α-(trifluoromethylsulfonyloxyimino)-4-methoxyphenylacetonitrile, α-(ethylsulfonyloxyimino)-4-methoxyphenylacetonitrile, α-(propylsulfonyloxyimino)-4-methylphenylacetonitrile, and α-(methylsulfonyloxyimino)-4-bromophenylacetonitrile.

Of these oxime sulfonate compounds, each of those having methyl group, ethyl group or another lower alkyl group as the substituent $R^6$ are desirable, as they have high crosslinking efficiency, have high sensitivity and definition, and can give a rectangular resist pattern.

The hydrocarbon group represented by $R^7$ in the formula (IV) includes aryl groups and nonaromatic hydrocarbon groups. Of such aryl groups, those having 6 to 14 carbon atoms are preferable such as a phenyl group, tolyl group, methoxyphenyl group, xylyl group, biphenyl group, naphthyl group, and anthryl group. As the nonaromatic hydrocarbon groups, there may be mentioned hydrocarbon groups having no aromatic ring such as benzene ring or naphthalene ring. To be more specific, illustrative nonaromatic hydrocarbon groups include aliphatic hydrocarbon groups, alicyclic hydrocarbon groups and hydrogenated aromatic hydrocarbon groups, such as alkyl groups, alkenyl groups, cycloalkyl groups, cycloalkenyl groups and hydrogenated aryl groups, of such alkyl and alkenyl groups, either straight chain or branched groups can be used, and those having 1 to 12 carbon atoms are preferred, whereas of such cycloalkyl and cycloalkenyl groups, those having 4 to 12 carbon atoms are preferred. Examples of the alkyl groups include methyl group, ethyl group, propyl group, isopropyl group, n-butyl group, sec-butyl group, tert-butyl group, n-pentyl group, n-octyl group, and n-dodecyl group; the alkenyl groups include, for example, ethenyl group, propenyl group, butenyl group, butadienyl group, hexenyl group, and octadienyl group; the cycloalkyl groups include, for instance, cyclopentyl group, cyclohexyl group, cyclooctyl group, and cyclododecyl group; the cycloalkenyl groups include, for example, 1-cyclobutenyl group, 1-cyclopentenyl group, 1-cyclohexenyl group, 1-cycloheptenyl group, and 1-cyclooctenyl group; and the hydrogenated aryl groups include, for instance, dihydrophenyl group and hexahydronaphthyl group.

As the substituted hydrocarbon groups represented by $R^7$, there may be mentioned the aforementioned aryl groups or nonaromatic hydrocarbon groups, one or more of whose hydrogen atoms are substituted with inactive substituents. Such inactive substituents include chlorine, bromine, fluorine and other halogen atoms, hydroxyl group, alkoxy groups, and acyl groups. As $R^7$, typically preferred are halogenated alkyl groups such as chloromethyl group, trichloromethyl group, trifluoromethyl group, 2-bromopropyl group and other halogenated alkyl groups each having 1 to 4 carbon atoms, and alkoxyphenyl groups such as 4-methoxyphenyl group and 4-ethoxyphenyl group.

The substituent X in the oxime sulfonate compound represented by the formula (IV) is a divalent or trivalent hydrocarbon group, and preferably is a divalent or trivalent aliphatic or aromatic hydrocarbon group.

Of these compounds, those having a methyl group, ethyl group or another lower alkyl group as $R^7$ are desirable. The repetition number n is 2 or 3, and preferably is 2.

Practical examples of the oxime sulfonate compound represented by the formula (IV) include the following compounds:

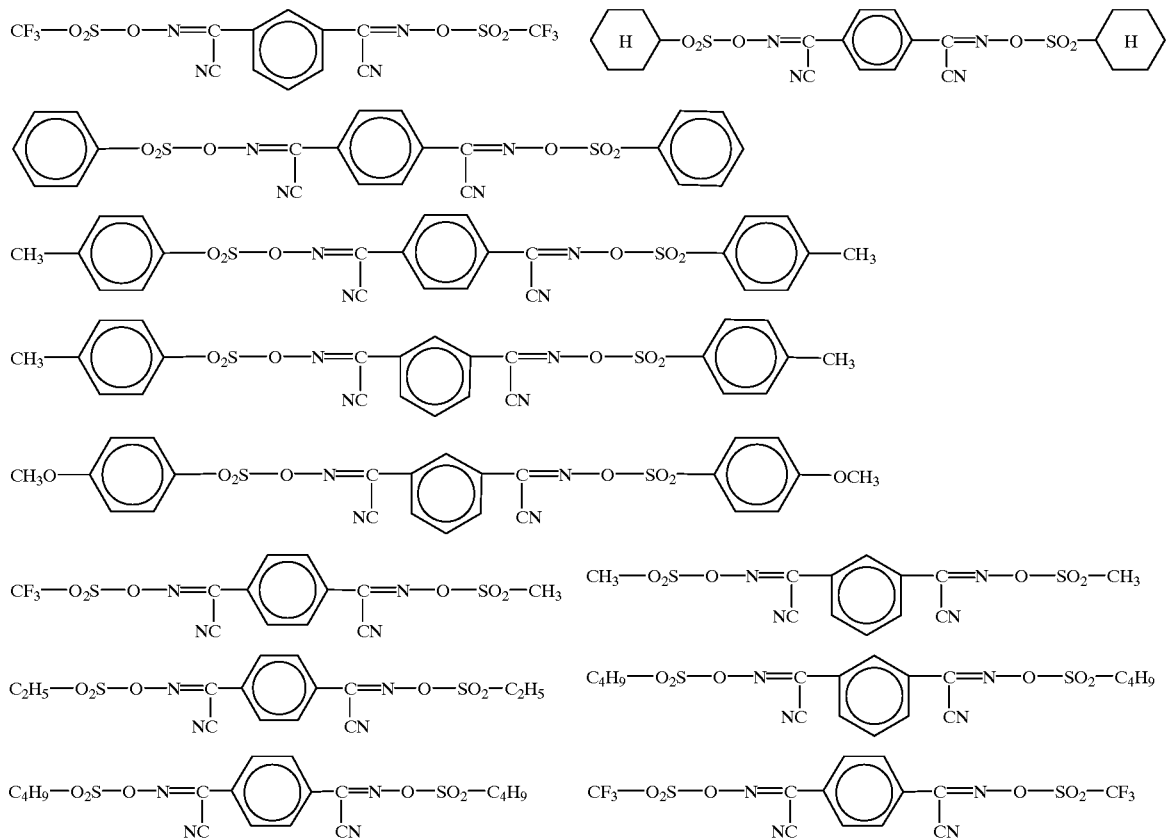

Each of the acid generating agents (C) can be used singly or in combination. Where necessary, it can be used in combination with any known acid generating agent used in conventional resist compositions.

The proportion of Ingredient (C) preferably ranges from 0.1 to 30 parts by weight and more preferably from 1 to 20 parts by weight relative to 100 parts by weight of Ingredient (A).

(D) Sensitizing substance

The term "sensitizing substance" as used herein means a substance which accumulates electrons or energy through electron beam exposure and reemits the accumulated electrons or energy into a resist film to thereby increase the sensitivity of resist (sensitization).

The sensitization of a resist is presumably caused by increased efficiency of acid generation by the acid generating agent and hence enhanced crosslinking, which are due to electrons or energy reemitted from the sensitizing substance.

Such sensitizing substances can be liberally chosen from compounds that are soluble in solvents used for the preparation of resist compositions and soluble in aqueous alkaline solutions used as a developer. Among the sensitizing substances, are preferred compounds represented by the following formula (II):

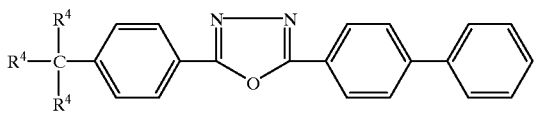

wherein $R^4$ is independently an alkyl group having 1 to 3 carbon atoms. Among them, typically preferred for its satisfactory sensitization properties is a compound represented by the following formula (V):

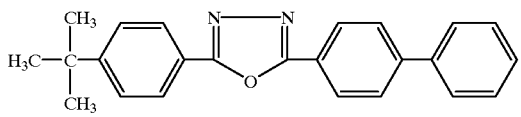

The proportion of Ingredient (D) should preferably fall in the range of from 0.1 to 10 parts by weight relative to 100 parts by weight of Ingredient (A).

If the proportion of Ingredient (D) is less than 0.1 part by weight, a satisfactory sensitizing effect is not obtained, whereas if it exceeds 10 parts by weight, the solubility of unexposed areas is markedly deteriorated, which inhibits the formation of sole patterns in the formation of resist patterns having fine line and space width (L&S). For this reason, the proportion should more preferably fall in the range of from 1 to 5 parts by weight relative to 100 parts by weight of Ingredient (A).

(E) Other ingredients

The composition of the invention may further comprise, where necessary, a variety of amines in order to improve the shape of resist patterns and the stability of latent image with the elapse of time from exposure to development. Examples of such amines include ethylamine, diethylamine, triethylamine, n-propylamine, di-n-propylamine, tri-n-propylamine, n-butylamine, tert-butylamine, di-n-butylamine, di-tert-butylamine, tri-n-butylamine, tri-tert-butylamine and other aliphatic amines; benzylamine, aniline, N-methylaniline, N,N-dimethylaniline and other aromatic amines; pyridine, 2-methylpyridine, 2-ethylpyridine, 2,3-dimethylpyridine and other heterocyclic amines. Of these amines, diethylamine, dipropylamine, dibutylamine and other secondary aliphatic amines are desirable.

In electron beam negative working resists, a top edge of a resist pattern may become round, or a tailing pattern may be formed due to the scattering of an electron beam from behind a substrate when forming dense patterns. In this case, sole patterns cannot be formed. The secondary aliphatic amines satisfactorily improve such defective shapes of patterns.

In particular, this improving effect of secondary aliphatic amines is seen in combinations using of a melamine resin having a large content of a hexamethoxymethylated melamine as the acid-crosslinkable substance (B), and of these secondary aliphatic amines, dibutylamine can advantageously be employed.

Where necessary, the composition of the invention may further comprise any carboxylic acid. Such carboxylic acids include, for example, butyric acid, isobutyric acid, oxalic acid, malonic acid, succinic acid, acrylic acid, crotonic acid, isocrotonic acid, 3-butenic acid, methacrylic acid, 4-pentenic acid and other saturated or unsaturated aliphatic carboxylic acids; 1,1-cyclohexanedicarboxylic acid, 1,2-cyclohexanedicarboxylic acid, 1,3-cyclohexanedicarboxylic acid, 1,4-cyclohexanedicarboxylic acid, 1,1-cyclohexyldiacetic acid and other alicyclic carboxylic acids; p-hydroxybenzoic acid, o-hydroxybenzoic acid, 2-hydroxy-3-nitrobenzoic acid, 3,5-dinitrobenzoic acid, 2-nitrobenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 2-vinylbenzoic acid, 4-vinylbenzoic acid, phthalic acid, terephthalic acid, isophthalic acid and other aromatic carboxylic acids each having a substituent such as hydroxyl group, nitro group, carboxyl group and vinyl group.

Of these carboxylic acids, aromatic carboxylic acids are preferable in respect of their adequate acidity. Salicylic acid, i.e. o-hydroxybenzoic acid, is more preferable due to its good solubility in the organic solvents of the composition and good pattern-forming behavior on the substrates of various materials.

To provide a satisfactory shape of resist pattern and high sensitivity, the amount of the amine is, when added, in the range of from 0.01 to 1 part by weight, and preferably 0.02 to 0.5 part by weight relative to 100 parts by weight of Ingredient (A), and the amount of the carboxylic acid is, if added, in the range of from 0.01 to 1.0 part by weight and preferably from 0.02 to 0.5 part by weight relative to 100 parts by weight of the total of Ingredients (A) and (B).

(F) Solvent

The composition of the invention may preferably be used as a solution obtained by dissolving the individual ingredients in a solvent. Examples of suitable solvents include: ketone solvents such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol and dipropylene glycol monoacetate as well as monomethyl, monoethyl, monopropyl, monobutyl and monophenyl ethers thereof; cyclic ether solvents such as dioxane; and ester solvents such as methyl lactate, ethyl lactate, methyl acetate, ethyl acetate, butyl acetate, methyl pyruvate, ethyl pyruvate, methyl methoxypropionate and ethyl ethoxypropionate. These solvents can be used either singly or as a mixture of two kinds or more according to need.

It is of course-optional that the resist composition of the present invention be admixed with various known additives having compatibility with the above described essential and optional ingredients. Examples of such additives include auxiliary resins to improve the properties of the resist film, plasticizers, stabilizers, coloring agents, surface active agents and the like conventionally used as the ingredients in resist compositions.

Practically, the composition may be used, for example, in the following manner: Each of the ingredients of the composition is dissolved in a proper solvent as mentioned above to give a coating solution; the coating solution is then applied, using a spinner, onto a substrate such as a silicon wafer, and subsequently dried to form a dried photosensitive layer; next, the photosensitive layer is irradiated pattern-wise by scanning with electron beams to form a latent image of the pattern, followed by a post-exposure baking treatment. Thereafter, the latent image of the pattern is developed with a developer solution, for example, an aqueous alkaline solution such as a 1% to 10% by weight aqueous solution of tetramethylammonium hydroxide (TMAH), thus forming a resist pattern having a satisfactory profile shape with high definition.

The present invention will be further illustrated below in detail with reference to several inventive examples and comparative examples which are not directed to limiting the scope of the invention. Characteristics of each negative working resist compositions were evaluated in the following manner:

[Evaluation of Sensitivity]

A sample resist solution was applied onto a silicon wafer using a spinner, and dried on a hot plate at 110° C. for 90 sec. to give a resist layer having a thickness of 500 nm. An electron beam was irradiated pattern-wise on the resist layer at an accelerating voltage of 50 kV and a current density of 5 A (amperes), using an electron beam irradiator HL-750D (Hitachi, Ltd., Japan). The pattern-wise exposed layer was heated at 110° C. for 90 sec.; subjected to development in a 2.38% by weight aqueous solution of tetramethylammonium hydroxide for 60 sec., followed by rinsing in water for 30 sec., and then dried.

In this procedure, the sensitivity was defined as the exposure dose ($\mu C/cm^2$; energy dose) to give a resist pattern of 0.15-$\mu$m line width with a ratio of line width to space width of 1:1.

[Evaluation of Definition]

The definition was estimated in terms of the critical definition at the exposure dose which was sufficient for reproduction of a pattern of 0.15 $\mu$m line width by undertaking the same patterning procedure as in the above "Evaluation of Sensitivity".

EXAMPLE 1

An electron beam negative working resist composition was prepared in the following manner: In 500 parts by weight of propylene glycol monomethyl ether acetate were dissolved 100 parts by weight of a copolymer of hydroxystyrene and styrene (80:20, ratio of monomers) with a weight average molecular weight (Mw) of 2500, and 5 parts by weight of a melamine resin with a hexamethoxymethylated melamine content of 90% to 100%, Nikalac MW-3 OHM (Sanwa Chemical Co., Ltd.), and to the resulting solution were added 10 parts by weight of a-(methylsulfonyloxyimino)-4-methoxybenzyl cyanide (the following formula (VI)) as an acid generating agent, 3 parts by weight of 2-(4-biphenyl)-5-(4-tert-butylphenyl)-1,3,4-oxadiazole (the following formula (V)), 0.19 part by weight of di-n-butylamine and 0.20 part by weight of salicylic acid to give an electron beam negative working resist composition solution.

The prepared resist solution was subjected to the evaluation of sensitivity and definition described above, and the resultant sensitivity and definition were 5.0 $\mu C/cm^2$ and 0.12 $\mu$m, respectively.

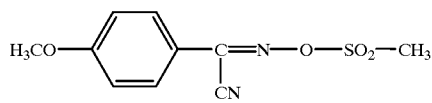

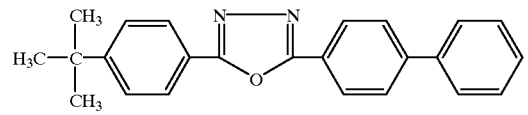

EXAMPLE 2

A resist solution was prepared in a manner similar to Example 1, except that the amount of 2-(4-biphenyl)-5-(4-tert-butylphenyl)-1,3,4-oxadiazole was changed from 3 parts by weight to 5 parts by weight. The obtained resist solution was subjected to the evaluation of sensitivity and definition, and the resulting sensitivity and definition were 4.5 $\mu C/cm^2$ and 0.14 $\mu$m, respectively.

COMPARATIVE EXAMPLE

A resist solution was prepared in a manner similar to Example 1 and subjected to the evaluation of sensitivity and definition, except that 2-(4-biphenyl)-5-(4-tert-butylphenyl)-1,3,4-oxadiazole was not added. The resulting sensitivity and definition were 6.0 $\mu C/cm^2$ and 0.12 $\mu$m, respectively.

The electron beam negative working resist composition of the invention exhibits satisfactorily high sensitivity with the addition of Ingredient (D) to basic Ingredients (A), (B) and (C).

The use of the inventive electron beam negative working resist composition provides shortened exposure time with improved throughput.

Other embodiments and variations will be obvious to those skilled in the art, and this invention is not to be limited except as set forth in the following claims.

What is claimed is:

1. An electron bean negative working resist composition comprising:
   (A) an alkali-soluble resin,
   (B) an acid-crosslinkable substance,
   (C) an acid generating agent, and
   (D) a sensitizing substance, said sensitizing substance (D) being a substance which serves to accumulate electrons or energy through electron beam exposure and to reemit the accumulated electrons or energy into a resist film and is a compound represented by the following formula (I):

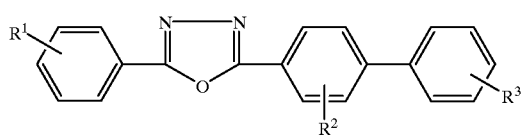

wherein $R^1$ is an aryl group or an alkyl group having 1 to 10 carbon atoms, each of $R^2$ and $R^3$ is independently a hydrogen atom, an aryl group, or an alkyl group having 1 to 10 carbon atoms.

2. The composition according to claim 1, wherein said sensitizing substance (D) is a compound represented by the following formula (II):

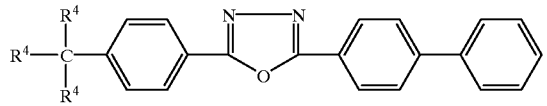
(II)

wherein $R^4$ is an alkyl group having 1 to 3 carbon atoms.

3. The composition according to claim 2, wherein $R^4$ is methyl group.

4. The composition according to claim 1, wherein the content of Ingredient (D) ranges from 0.1 to 10 parts by weight relative to 100 parts by weight of Ingredient (A).

5. The composition according to claim 1 or 2, wherein the acid generating agent is a compound represented by the following formula (III):

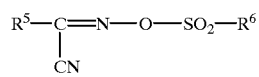
(III)

wherein $R^5$ is an aromatic group and $R^6$ is a lower alkyl group or a halogenated lower alkyl group.

6. The composition according to claim 1 or 2, wherein the acid generating agent is a compound represented by the following formula (IV):

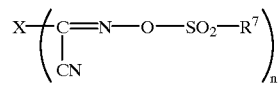
(IV)

wherein X is a divalent or trivalent hydrocarbon group, $R^7$ is a hydrocarbon group or a substituted hydrocarbon group, and n is 2 or 3.

* * * * *